United States Patent
Ota et al.

(10) Patent No.: US 9,780,170 B2
(45) Date of Patent: Oct. 3, 2017

(54) SEMICONDUCTOR MEMORY DEVICE

(71) Applicant: TOSHIBA MEMORY CORPORATION, Minato-ku (JP)

(72) Inventors: Kensuke Ota, Tama (JP); Toshifumi Irisawa, Bunkyo (JP); Tomoya Kawai, Kawasaki (JP); Daisuke Matsushita, Fujisawa (JP); Tsutomu Tezuka, Tsukuba (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/204,364

(22) Filed: Jul. 7, 2016

(65) Prior Publication Data

US 2017/0040416 A1    Feb. 9, 2017

(30) Foreign Application Priority Data

Aug. 4, 2015  (JP) ................. 2015-153924

(51) Int. Cl.

| | | |
|---|---|---|
| H01L 29/10 | (2006.01) | |
| H01L 29/24 | (2006.01) | |
| H01L 27/1157 | (2017.01) | |
| H01L 27/11582 | (2017.01) | |
| H01L 27/11573 | (2017.01) | |
| G11C 16/10 | (2006.01) | |
| G11C 5/02 | (2006.01) | |

(Continued)

(52) U.S. Cl.
CPC .......... *H01L 29/1037* (2013.01); *G11C 5/025* (2013.01); *G11C 16/0483* (2013.01); *G11C 16/10* (2013.01); *G11C 16/14* (2013.01); *H01L 27/1157* (2013.01); *H01L 27/11573* (2013.01); *H01L 27/11582* (2013.01); *H01L 29/24* (2013.01)

(58) Field of Classification Search
CPC . H01L 29/1037; H01L 29/24; H01L 27/1157; H01L 27/11582; H01L 27/11573; G11C 16/10; G11C 16/0466
See application file for complete search history.

(56) References Cited

U.S. PATENT DOCUMENTS

2011/0114941 A1* 5/2011 Kato .................. G11C 16/0466
257/43
2011/0180793 A1* 7/2011 Taniguchi ........... H01L 29/7869
257/43

FOREIGN PATENT DOCUMENTS

| JP | 2008-171838 | 7/2008 |
|---|---|---|
| JP | 2011-124563 | 6/2011 |
| JP | 2011-155061 | 8/2011 |

OTHER PUBLICATIONS

Jun Yong Bak et al. "Nonvolatile Charge-Trap Memory Transistors With Top-Gate Structure Using In—Ga—Zn—O Active Channel and ZnO Charge-Trap Layer," IEEE Electron Device Letters, vol. 35, No. 3, Mar. 2014, 3 Pages.

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A semiconductor memory device of an embodiment comprises a memory cell. This memory cell comprises: an oxide semiconductor layer; a gate electrode; and a charge accumulation layer disposed between the oxide semiconductor layer and the gate electrode. This oxide semiconductor layer includes a stacked structure of an n type oxide semiconductor layer and a p type oxide semiconductor layer.

23 Claims, 16 Drawing Sheets

(51) Int. Cl.
*G11C 16/04* (2006.01)
*G11C 16/14* (2006.01)

SEMICONDUCTOR MEMORY DEVICE

CROSS REFERENCE TO RELATED APPLICATION

This application is based upon and claims the benefit of priority from JP Patent Application No. 2015-153924, filed on Aug. 4, 2015, the entire contents of which are incorporated herein by reference.

FIELD

Embodiments described in the present specification relate to a semiconductor memory device.

BACKGROUND

In the field of NAND type flash memory, a stacked type (three-dimensional type) NAND type flash memory has been receiving attention as a device capable of achieving a high level of integration without being limited by a resolution limit of lithography technology. This kind of three-dimensional type NAND type flash memory comprises a stacked body in which a plurality of conductive layers each functioning as a word line or select gate line and a plurality of inter-layer insulating layers are stacked alternately on a substrate, and comprises a column shaped semiconductor layer disposed so as to penetrate this stacked body. This semiconductor layer functions as a channel of a memory cell, and disposed sequentially between the semiconductor layer and the conductive layer in the stacked body are a block insulating layer, a memory gate insulating layer including a charge accumulation layer, and a tunnel insulating layer.

Conventionally, polysilicon has often been employed as a material of this semiconductor layer. However, it is difficult to achieve a combination of both film thinning and higher mobility of the channel required in next generation large capacity memory, by polysilicon. Furthermore, there is also a problem that polysilicon has a high process temperature, hence suffers a limitation of process.

DETAILED DESCRIPTION

A semiconductor memory device of an embodiment described below comprises a memory cell. This memory cell comprises: an oxide semiconductor layer; a gate electrode; and a charge accumulation layer disposed between the oxide semiconductor layer and the gate electrode. This oxide semiconductor layer includes a stacked structure of an n type oxide semiconductor layer and a p type oxide semiconductor layer.

Semiconductor memory devices according to embodiments will be described in detail below with reference to the accompanying drawings. Moreover, in the embodiments below, a NAND type flash memory which is a nonvolatile semiconductor memory device that stores data in a nonvolatile manner, will be described as an example. Note that these embodiments are merely examples, and are not shown with the intention of limiting the present invention. For example, the semiconductor memory devices described below have a structure in which a memory string extends linearly in a direction intersecting a substrate surface, but a similar structure may be applied also to a U-shaped structure in which the memory string is doubled back on an opposite side midway. In addition, each of the drawings of the semiconductor memory devices employed in the embodiments below is schematic, and thicknesses, widths, ratios, and so on, of layers are not necessarily identical to those of the actual semiconductor memory devices.

First Embodiment

Figure 1:
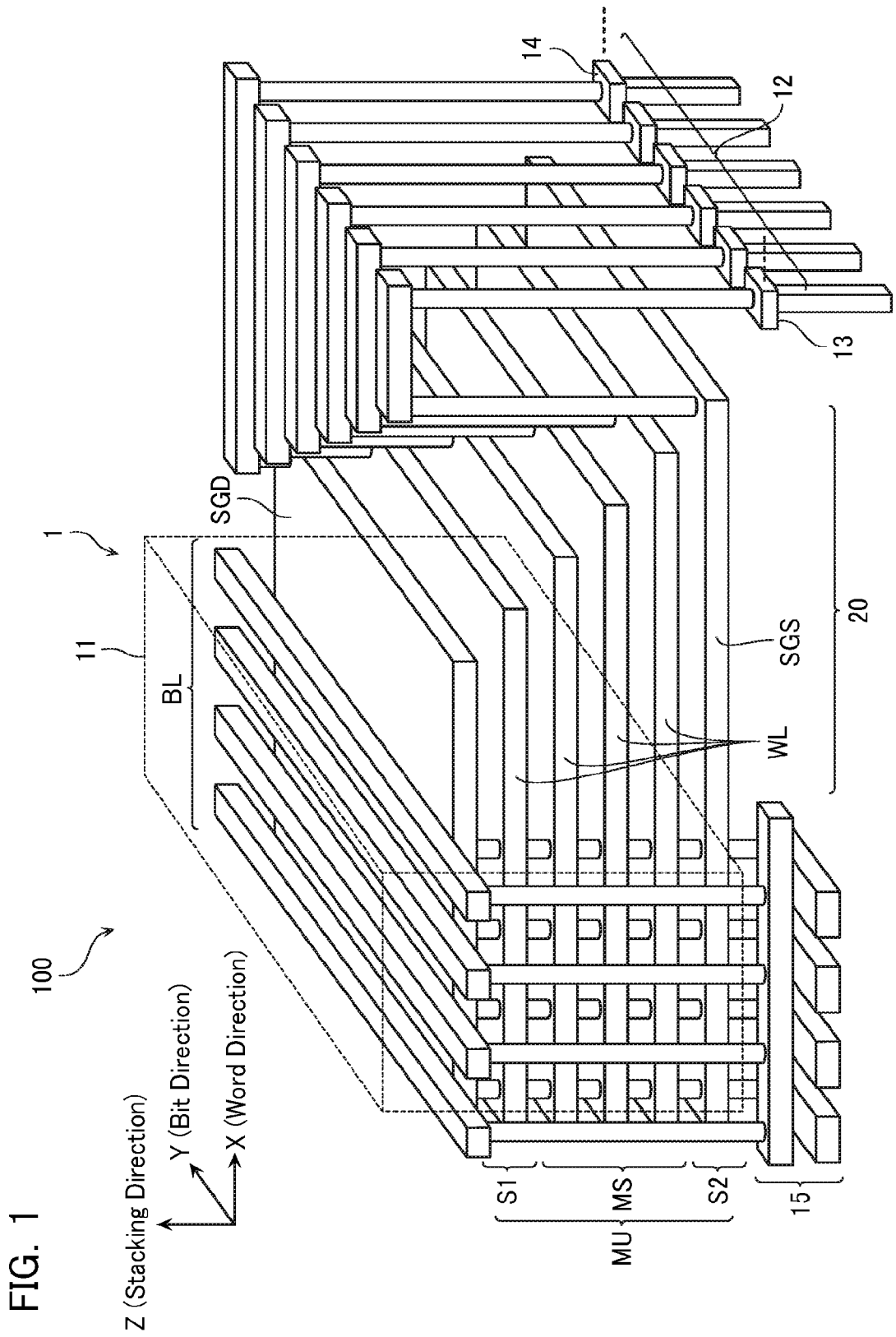
FIG. 1 is a perspective view showing schematically one example of a structure of a semiconductor memory device 100 of a first embodiment.

FIG. 1 is a perspective view showing schematically one example of a structure of a semiconductor memory device 100 of a first embodiment. The semiconductor memory device 100 includes: a memory cell array 11; a word line drive circuit 12; a source side select gate line drive circuit 13; a drain side select gate line drive circuit 14; a sense amplifier 15; a word line WL; a source side select gate line SGS; a drain side select gate line SGD; a bit line BL; a word line wiring line portion; and so on.

The memory cell array 11 comprises the following, on a semiconductor substrate (not illustrated in FIG. 1), namely: a memory string MS having a plurality of memory cells MC (memory transistors) connected in series therein; and a drain side select transistor S1 and a source side select transistor S2 respectively connected to both ends of the memory string MS. Note that the memory string MS and the drain side select transistor S1 and source side select transistor S2 connected to both ends of the memory string MS will be referred to below as "NAND cell unit NU".

As will be mentioned later, the memory cell MC has a structure in which a control gate electrode (word line) is provided, via a memory layer including a charge accumulation layer, on a side surface of a columnar semiconductor film acting as a channel; and the drain side select transistor and source side select transistor have a structure in which a select gate electrode (select gate line) is provided, via a memory layer including a charge accumulation layer, on a side surface of a columnar semiconductor film. To simplify illustration, FIG. 1 illustrates the case where four memory cells MC are provided in one memory string MS, but the number of memory cells MC in one memory string MS is of course not limited to this.

The word line WL is commonly connected to memory cells adjacent in an X direction (word line direction) in FIG. 1. Moreover, the source side select gate line SGS is commonly connected to source side select transistors S2 adjacent in the word line direction, and the drain side select gate line SGD is commonly connected to drain side select transistors S1 adjacent in the word line direction. Note that in the description below, the source side select gate line SGS and the drain side select gate line SCD are sometimes collectively written simply as "select gate line". Moreover, the source side select transistor and the drain side select transistor are sometimes collectively written simply as "select transistor".

Note that sometimes, one or a plurality of the memory cells MC closely adjacent to the source side select gate line SGS and the drain side select gate line SGD, of the memory cells MC in the memory string MS, is treated as a dummy cell not employed in data storage. In the example described below, one dummy cell is respectively provided to both ends of the memory string MS, but the present invention is not intended to be limited to this configuration and there may be two or more dummy cells. Moreover, it is also possible for the dummy cell to be omitted.

Furthermore, the bit lines BL are disposed so as to extend having as their longitudinal direction a Y direction (bit line direction) intersecting the X direction (word line direction), and are arranged with a certain pitch in the X direction. The bit line BL is connected to a plurality of the memory strings MS via the drain side select transistor S1. Although illustration thereof is omitted in FIG. 1, a source line SL is disposed having the Y direction as its longitudinal direction, for example, and is connected to the memory string MS via the source side select transistor S2.

The word line drive circuit 12 is a circuit that controls a voltage applied to the word line WL; the source side select gate line drive circuit 13 is a circuit that controls a voltage applied to the source side select gate line SGS; and the drain side select gate line drive circuit 14 is a circuit that controls a voltage applied to the drain side select gate line SGD. Moreover, the sense amplifier 15 is a circuit that amplifies a signal (voltage) read in the bit line BL from a selected memory cell. Due to these circuits, a voltage is applied to the select gate line or word line, and a later-mentioned write operation or read operation and an erase operation to the memory cell MC, are controlled. That is, the semiconductor memory device of the present embodiment comprises a control unit that performs the write operation or read operation and the erase operation.

A wiring line portion 20 is a wiring line portion for connecting the word line WL and the select gate lines SGD and SGS to a contact. The word line WL and the select gate lines SGS and SGD have a structure of being processed in steps so as to each be capable of being connected to the contact independently at their upper portions.

Figure 2:
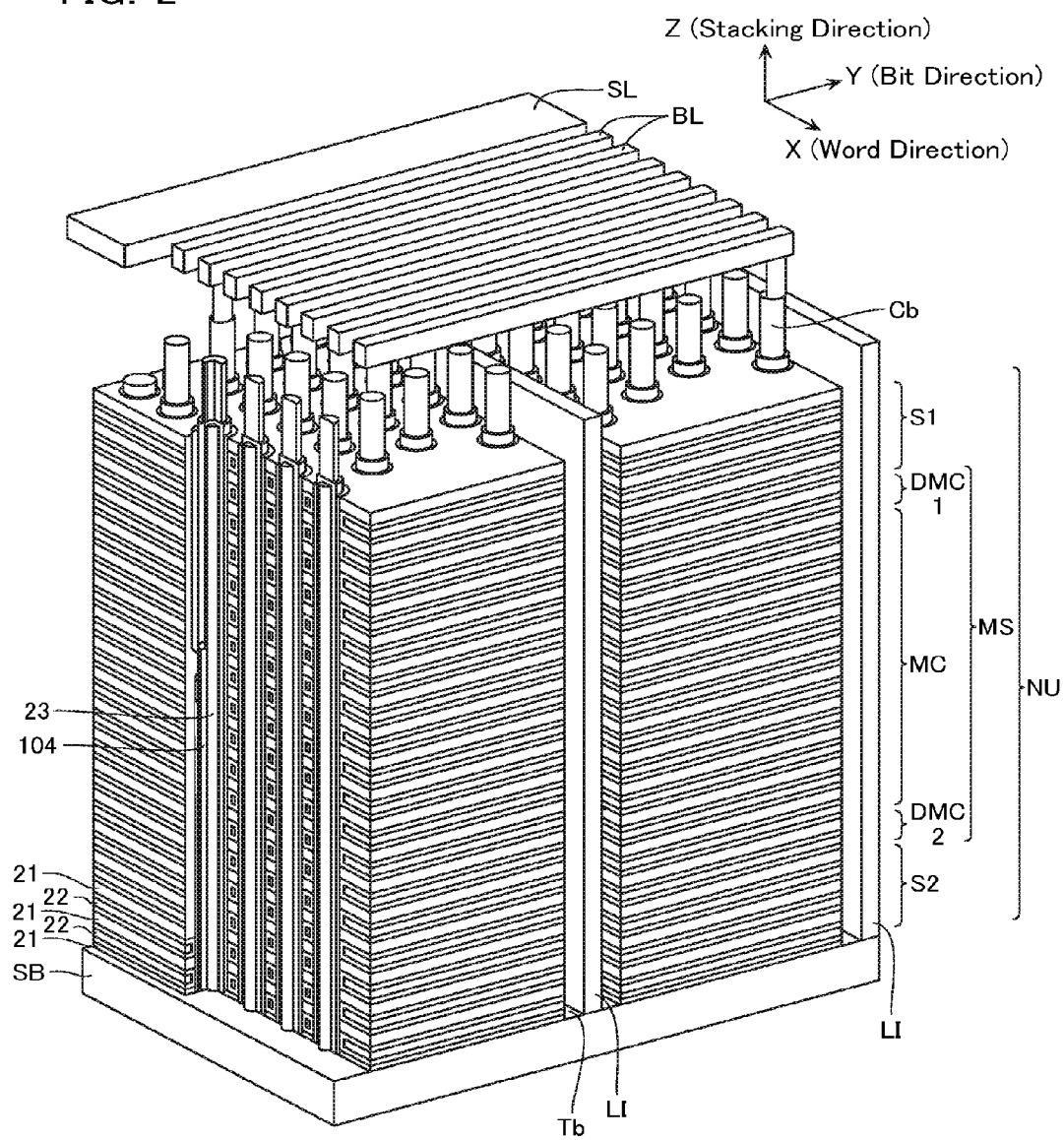
FIG. 2 is a perspective view showing a structure of part of a memory cell array 11.
Figure 3:
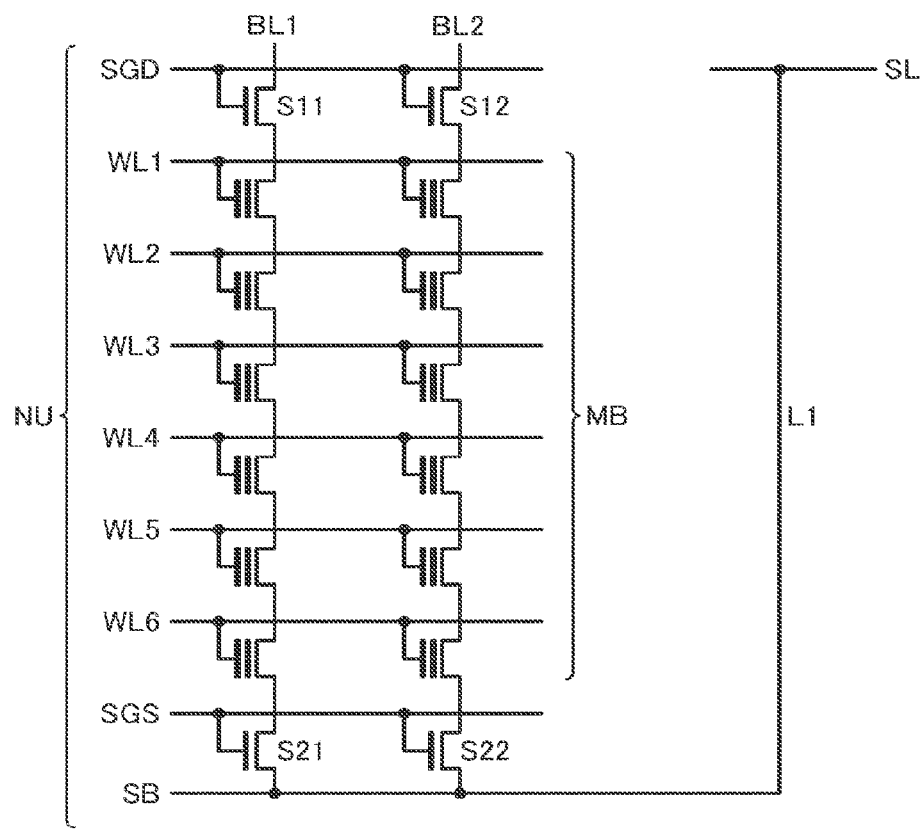
FIG. 3 is an equivalent circuit diagram of one NAND cell unit NU.
Figure 4:
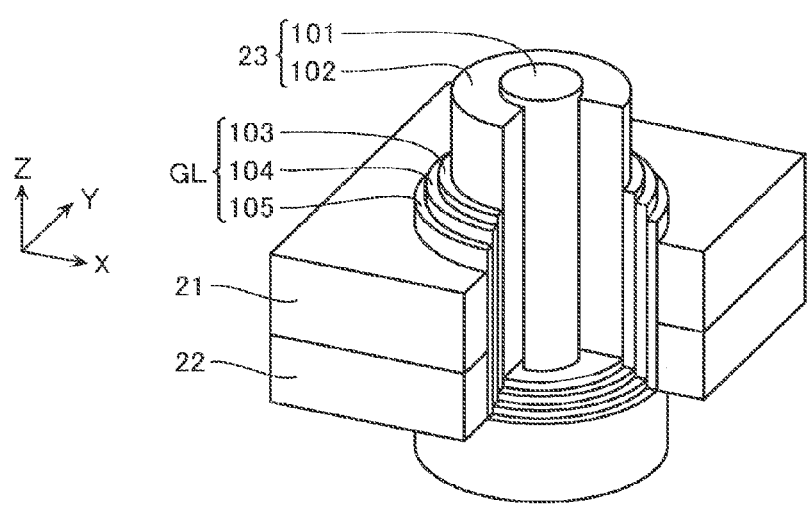
FIG. 4 is a perspective cross-sectional view of one memory cell MC.

Next, details of a structure of the memory cell array 11 will be described with reference to FIGS. 2 to 4. FIG. 2 is a perspective view showing a structure of part of the memory cell array 11; FIG. 3 is an equivalent circuit diagram of one NAND cell unit NU; and FIG. 4 is a perspective cross-sectional view of one memory cell MC, and so on.

As shown in FIG. 2, the memory cell array 11 has a structure in which an inter-layer insulating layer 21 and a conductive layer 22 are stacked alternately on a semiconductor substrate SB. This conductive layer 22 functions as a control gate of the memory cell MC (word line WL), as the source side select gate line SGS, and as the drain side select gate line SGD. The inter-layer insulating layer 21 is disposed above and below these conductive layers 22, and electrically insulates fellow conductive layers 22.

The conductive layer 22 may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or by a compound of these. However, the conductive layer 22 may also be formed by polysilicon to which an impurity is added.

Moreover, semiconductor layers 23 are arranged with a certain pitch in the XY plane having a stacking direction (Z direction of FIG. 2) as their longitudinal direction, so as to penetrate a stacked body of such an inter-layer insulating layer 21 and conductive layer 22. Formed between the semiconductor layer 23 and the stacked body of the conductive layer 22 and the inter-layer insulating layer 21 is a memory layer 104 that includes the charge accumulation layer. The memory layer 104 may be formed from a stacked structure of the charge accumulation layer of the likes of a silicon nitride film, and an oxide film of the likes of a silicon oxide film. A threshold voltage of the memory cell MC changes by an accumulated amount of charge to this charge accumulation layer, and the memory cell MC stores data corresponding to this threshold voltage.

The semiconductor layer 23 functions as a channel region (body) of the memory cell MC, dummy cells DMC1 and DMC2, and the select transistors S1 and S2 included in the NAND cell unit NU. These semiconductor layers 23 are connected at their upper ends to the bit line BL via a contact Cb. The bit lines BL are arranged with a certain pitch in the X direction having the Y direction as their longitudinal direction.

In addition, a lower end of the semiconductor layer 23 is electrically connected to the semiconductor substrate SB, and, as will be mentioned later, the lower end of the semiconductor layer 23 is connected to the source line SL via this substrate SB and a later-mentioned source contact LI. The source lines SL are arranged having the Y direction as their longitudinal direction, similarly to the bit lines BL.

Note that the stacked body of the inter-layer insulating layer 21 and the conductive layer 22 in the memory cell array 11 is divided on a block-by-block basis, the block being a minimum unit of data erase. A trench Tb is formed at a boundary of division, this trench Tb is implanted with an unillustrated inter-layer insulating layer, and the previously mentioned source contact LI is further formed penetrating that inter-layer insulating layer. This source contact LI has its lower end connected to the semiconductor substrate SB while having its upper end connected to the source line SL.

FIG. 3 is an equivalent circuit diagram of one NAND cell unit NU. In this memory cell array 11, one NAND cell unit NU comprises: the memory string MS configured from a plurality of the memory cells MC; the drain side select transistor S1 connected between the bit line BL and an upper end of the memory string MS; and the source side select transistor S2 connected between the source line SL and a lower end of the memory string MS.

One example of a specific structure of one memory cell MC and dummy cell DMC is shown in FIG. 4. The columnar semiconductor layer 23 comprises: an oxide film core 101; and a columnar oxide semiconductor layer 102 surrounding a periphery of the oxide film core 101. The oxide film core 101 is configured from, for example, a silicon oxide film ($SiO_2$).

Moreover, in the present embodiment, the oxide semiconductor layer 102 has a two-layer structure of an n type oxide semiconductor and a p type oxide semiconductor. A detailed configuration of this oxide semiconductor layer 102 or a material thereof will be mentioned in detail later.

Formed in a periphery of this oxide semiconductor layer 102 so as to surround the oxide semiconductor layer 102 are a tunnel insulating layer 103, the memory layer 104 including the charge accumulation layer, and a block insulating layer 105. The tunnel insulating layer 103 is configured from, for example, a silicon oxide film (SiOx), and functions as a tunnel insulating layer of the memory cell MC or dummy cell DMC. The memory layer 104 includes the charge accumulation layer configured from, for example, a silicon nitride film (SiN), and functions to trap electrons injected via the tunnel insulating layer 103 from the oxide semiconductor layer 102 by the write operation. The block insulating layer 105 may be formed from, for example, a silicon oxide film.

The above-described tunnel insulating layer 103, memory layer 104, and block insulating layer 105 are referred to collectively as a memory gate insulating layer GL. In the case of FIG. 4, the memory gate insulating layer GL is configured by three layers, but, although conceivably having a variety of structures in which number or order, a material, and so on, of layers are made different, the memory gate insulating layer GL includes at least the above-described charge accumulation layer. Moreover, in the present embodiment, the memory gate insulating layer GL is disposed on an entire region of a side surface of the oxide semiconductor layer 102.

Note that also employable as a material of the tunnel insulating layer 103 and the block insulating layer 105, besides a silicon oxide film (SiOx) are, for example, Al2O3, Y2O3, La2O3, Gd2O3, Ce2O3, CeO2, Ta2O5, HfO2, ZrO2, TiO2, HfSiO, HfAlO, ZrSiO, ZrAlO, AlSiO, and so on.

However, the oxide semiconductor used as the channel in the present embodiment includes oxygen. Therefore, sometimes, due to the material employed in the tunnel insulating film or block insulating film, oxygen ends up being taken away from the oxide semiconductor layer or, conversely, the oxide semiconductor layer ends up taking away oxygen.

If oxygen is taken away from the oxide semiconductor layer, mobility in the channel lowers and cell characteristics deteriorate. Moreover, if the oxide semiconductor layer takes away oxygen, an electron trap ends up occurring in an insulating layer from which oxygen was taken, and likewise, mobility lowers, whereby cell characteristics deteriorate.

Accordingly, a so-called High-k film of high permittivity may be used as the material of the tunnel insulating layer and the block insulating layer.

The previously mentioned inter-layer insulating layer 21 and a tungsten electrode functioning as the conductive layer 22 are stacked alternately in the periphery of the oxide semiconductor layer 102, via the memory gate insulating layer GL, so as to surround the oxide semiconductor layer 102. In other words, although in FIG. 4, a single layer, in other words, a single memory cell MC portion only, of the conductive layer 22 functioning as a gate electrode of the memory cell MC, is illustrated, a plurality of the conductive layers 22 are stacked above and below it via the inter-layer insulating layer 21.

On the other hand, as mentioned above, the memory gate insulating layer GL is disposed on the entire region of the side surface of the oxide semiconductor layer 102. In other words, in the present embodiment, the memory gate insulating layer GL is disposed straddling a plurality of the memory cells MC.

Figure 5A:
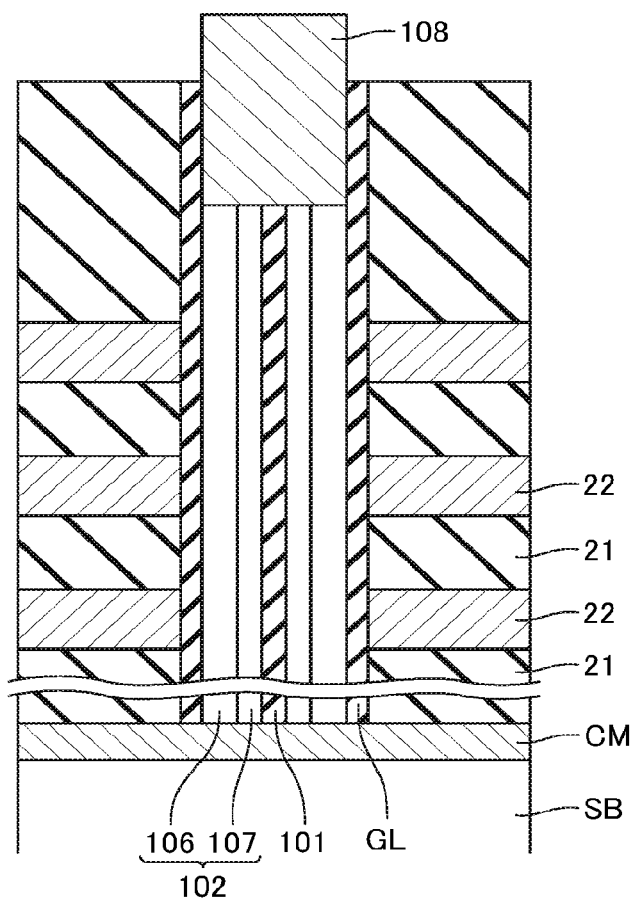
FIG. 5A is a cross-sectional view of part of the memory cell array 11 including the memory cell MC.

FIG. 5A is a schematic cross-sectional view showing a configuration of a portion including the memory cell MC, of the semiconductor memory device of the present embodiment. As mentioned above, the semiconductor memory device of the present embodiment has the oxide semiconductor layer 102 disposed on the substrate SB, via a contact metal CM, so as to extend in the direction intersecting the surface of the substrate SB.

Moreover, the memory gate insulating layer GL is disposed so as to surround the oxide semiconductor layer 102. The memory gate insulating layer GL includes the charge accumulation layer, and in the present embodiment, write/erase operations are performed by performing injection of electrons and injection of holes into this charge accumulation layer.

Disposed even more to the outside of the oxide semiconductor layer 102, via the memory gate insulating layer GL, is the stacked body having a plurality of the conductive layers 22 and inter-layer insulating layers 21 stacked alternately therein. In other words, the conductive layer 22 faces the oxide semiconductor layer 102 via the memory gate insulating layer GL. Each of these conductive layers 22 functions as the gate electrode of the memory cell MC. As a result of the above facts, a three-dimensional type semiconductor memory device in which a plurality of memory cells MC are stacked on a substrate, is configured.

Moreover, in the present embodiment, the oxide semiconductor layer 102 has a cylindrical shape extending in the direction that the inter-layer insulating layer 21 and conductive layer 22 are stacked, and surrounding a periphery of the core 101 configured from the likes of silicon oxide. Note that symbol 108 is a contact for achieving electrical connection between the channel (semiconductor layer 102) and the likes of a wiring line disposed in an upper portion of the memory cell MC.

The oxide semiconductor layer 102 in the present embodiment will be mentioned in more detail.

The oxide semiconductor layer 102 has a stacked structure of an n type oxide semiconductor layer 106 and a p type oxide semiconductor layer 107, the n type oxide semiconductor layer 106 being configured from an n type oxide semiconductor, and the p type oxide semiconductor layer 107 being configured from a p type oxide semiconductor. Moreover, in the present embodiment, the n type oxide semiconductor layer 106 is disposed to the outside, and the p type oxide semiconductor layer 107 is disposed on its inside.

In other words, the n type oxide semiconductor layer 106 is disposed facing the memory gate insulating layer GL. Moreover, the p type oxide semiconductor layer 107 is disposed facing the n type oxide semiconductor layer 106 and on an opposite side to the memory gate insulating layer GL of the n type oxide semiconductor layer 106.

The n type oxide semiconductor configuring the n type oxide semiconductor layer 106 includes, for example, InGaZnO which is an oxide of indium (In), gallium (Ga), and zinc (Zn). In addition, InO, GaO, or ZnO, or a combination of these may also be used. Although a variety of materials may thus be used as the n type oxide semiconductor, it is preferable that In, Ga, and Zn have an atomic ratio of 50% or more of configuration elements besides O.

Moreover, at least one element selected from the group of hafnium (Hf), tin (Sn), zirconium (Zr), lithium (Li), scandium (Sc), and nitrogen (N) may be added to the n type oxide semiconductor layer.

Utilizable as the p type oxide semiconductor configuring the p type oxide semiconductor layer 107 are the likes of monovalent copper oxide ($Cu_2O$), tin oxide (SnO), nickel oxide (NiO), or a combination of these.

The contact metal CM is provided to achieve physical connection while securing electrical connection between the oxide semiconductor layer 102 and the substrate SB.

Employable as a material of the contact metal CM employed to satisfy this condition are, for example, InZnO, InSnO, Ti, Mo, Au, GaZnO, Al, ZnO, Pt, Ni, Sn, or a combination of these, and so on.

Note that materials similar to those described above may be used also for the previously mentioned contact disposed in a channel (semiconductor layer 102) upper portion.

Particularly in the case that of the above-cited materials, InGaZnO is adopted as the n type oxide semiconductor layer 106 and $Cu_2O$ is adopted as the p type oxide semiconductor layer 107, InZnO or Au are preferably included.

Moreover, when InGaZnO is adopted as the n type oxide semiconductor layer 106 and SnO is adopted as the p type oxide semiconductor layer 107, InSnO, Ti, Au, or Al are preferably included.

Figure 5B:
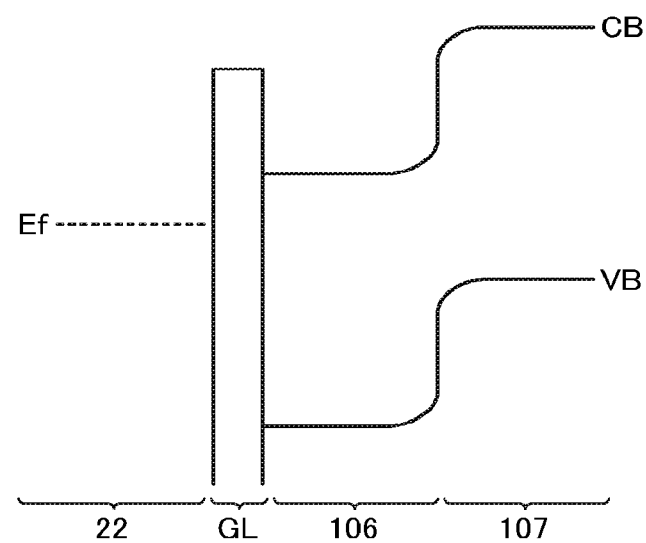
FIG. 5B is a band diagram showing energy bands of a conductive layer 22, a memory gate insulating layer GL, and oxide semiconductor layers 106 and 107 included in the memory cell MC.

FIG. 5B is a band diagram showing a relationship of energy bands of each region in the semiconductor memory device of the present embodiment, and shows a state at a non-bias time.

Specifically, the following are shown in order from the left side of FIG. 5B, namely, a Fermi level Ef of the conductive layer 22 (for example, tungsten) functioning as a control gate (gate electrode), an energy band of the memory gate insulating layer GL, a valence band VB and conduction band CB of the n type oxide semiconductor layer 106, and a valence band VB and conduction band CB of the p type oxide semiconductor layer 107.

In the present embodiment, by having an energy band configuration of the kind shown in FIG. 5B, the n type oxide semiconductor layer can be used as a transmission channel of electrons, and the p type oxide semiconductor layer can be used as a transmission channel of holes. This makes it possible to perform write/erase operations by injection of electrons and holes as will be described in detail below.

Figure 6:
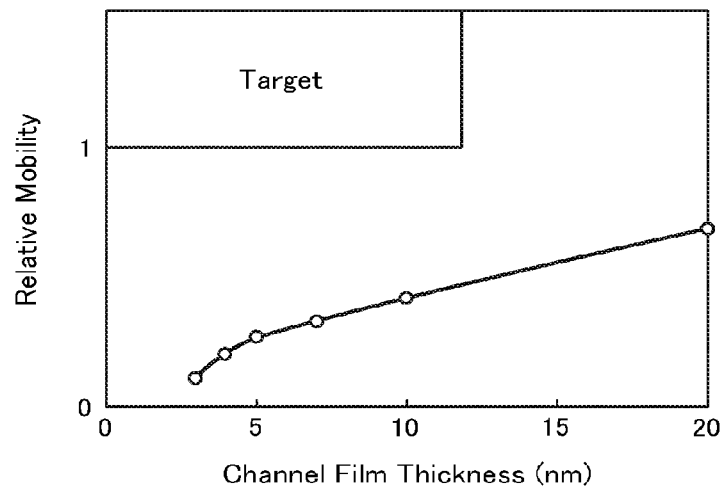
FIG. 6 is a graph showing a relationship of film thickness and mobility when polysilicon is used as a channel material, and a range required in a next generation memory.

FIG. 6 is a graph showing a relationship of channel film thickness and a relative value of mobility of a carrier moving along the channel, when polysilicon is employed as a channel material of the memory cell. In addition, a region shown by "Target" in the upper left region of the graph is a region showing channel film thickness and mobility required in a next generation large capacity memory previously mentioned. Note that the vertical axis of the graph shown in FIG. 6 shows relative mobility assuming a value of mobility required as a minimum in a next generation large capacity memory to be 1.

A next generation large capacity memory needs to simultaneously satisfy a reduction of hole diameter of a memory hole (film thinning of the channel) and a speeding up of mobility. However, as is clear from FIG. 6, that requirement cannot be satisfied by polysilicon. This is because polysilicon has a small grain size whereby scattering increases, hence there is a limit to speeding up of mobility of a carrier. Lowering of mobility means lowering of an On current flowing in the channel. This results in a NAND operation being hindered.

On the other hand, it was found that when an oxide semiconductor was employed as the channel material, there was a possibility of being able to solve a problem of film thinning and speeding up of the Target region in FIG. 6, and the structure described in the present embodiment was reached.

[Operation]

One example of the above-mentioned operation (write operation, erase operation, and read operation) of the semiconductor memory device of the first embodiment will be described. Described below is the case where the write operation and read operation are performed selecting one of the plurality of memory cells MC. Moreover, first, each of the operations will be described using the aforementioned equivalent circuit, then a principle of the operations will be explained along with characteristics of the oxide semiconductor.

(Write Operation)

Figure 7:
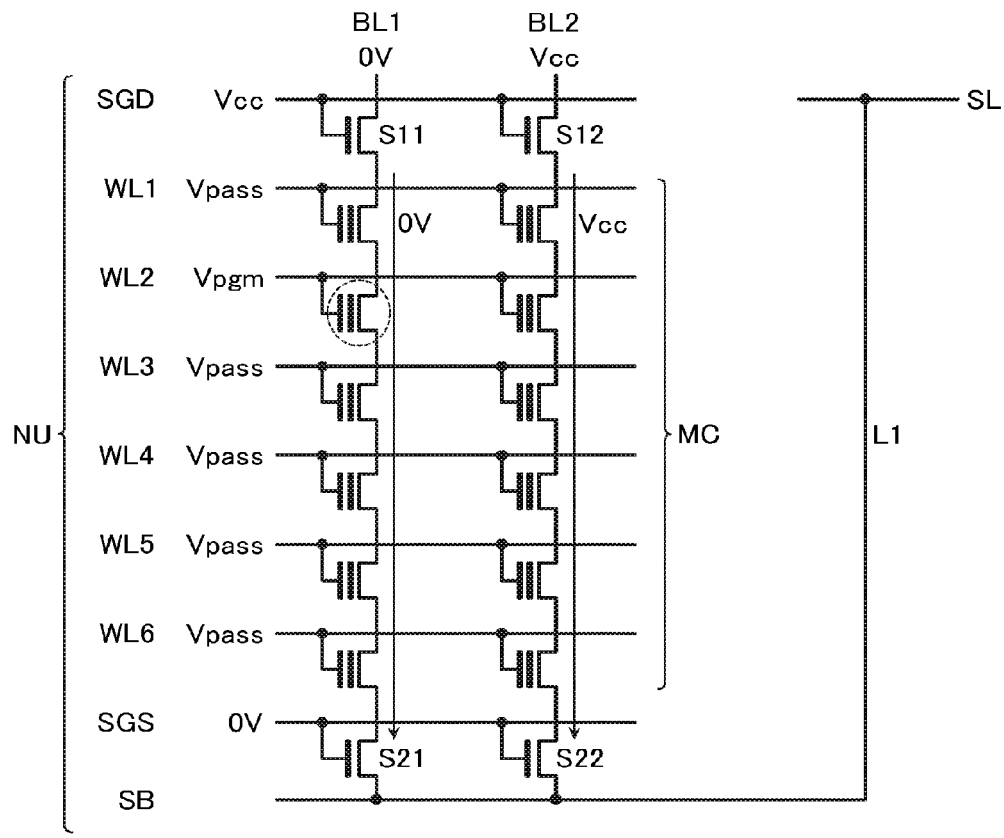
FIG. 7 is an equivalent circuit diagram showing an operation when performing write to one memory cell MC.

As shown in FIG. 7, during write, a program voltage (Vpgm) is transferred to a selected word line WL2 corresponding to a memory cell MC that has been selected (selected memory cell), and 0 V is transferred to a selected bit line BL1. In this case, in the selected bit line BL1, 0 V is transferred by electrons. A voltage difference between gate and channel of the selected cell results in electrons being injected into the charge accumulation layer of the selected memory cell, and a threshold value shifting. That is, write gets executed. At this time, electrons transferred to the selected bit line BL1 flow in the n type oxide semiconductor 106. The reason for this will be mentioned later. In addition, a write pass voltage Vpass is transferred to word lines WL1 and WL3 to WL6 that have not been selected (unselected word lines), and, of the memory cells MC connected to the selected bit line BL1, memory cells MC other than the selected memory cell (unselected memory cells) are not written to.

Moreover, a voltage Vcc is transferred to a bit line BL2 that has not been selected (unselected bit line). In this way, a select transistor S12 connected to the unselected bit line is set to an Off state, and the channel is held in a floating state. As a result, the memory cell MC connected to the unselected bit line BL2 attains a write-prohibited state, hence write is performed only on the selected memory cell.

(Erase Operation)

Figure 8:
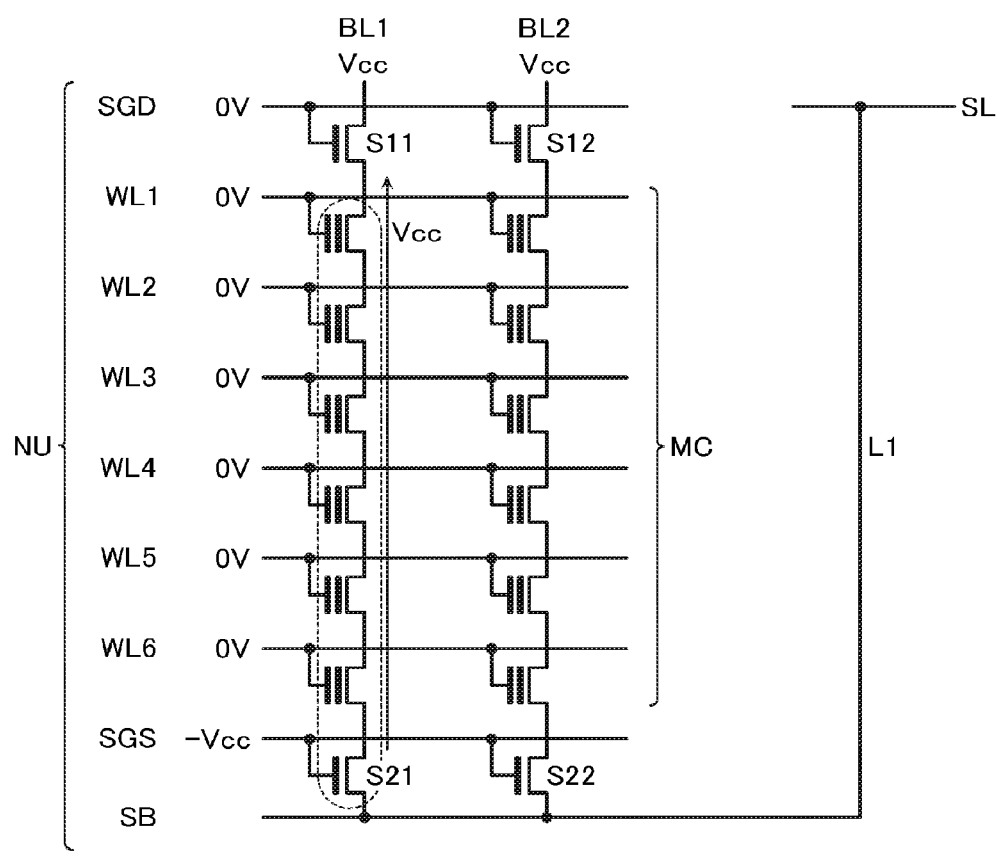
FIG. 8 is an equivalent circuit diagram showing an operation when performing erase on the memory cell MC that has undergone write.

The erase operation is performed simultaneously on an entire page to which the selected memory cell MC belongs. As shown in FIG. 8, during erase, a potential of all of the word lines WL1 to WL6 is set to 0 V, for example, and Vcc (>0 V) is transferred to the selected bit line BL1. In this case, in the selected bit line BL1, Vcc is transferred by holes. A voltage difference between gate and channel of the selected memory cell results in holes being injected into the charge accumulation layer of the selected memory cell, and a threshold value shifting. That is, erase gets executed. In this way, the oxide semiconductor layer which is a channel of the memory cell MC is provided with a voltage higher than that of the word line WL which is a gate of the memory cell MC, whereby the erase operation is performed. At this time, holes transferred to the selected bit line BL1 flow in the p type oxide semiconductor. The reason for this will be mentioned later.

(Read Operation)

Figure 9:
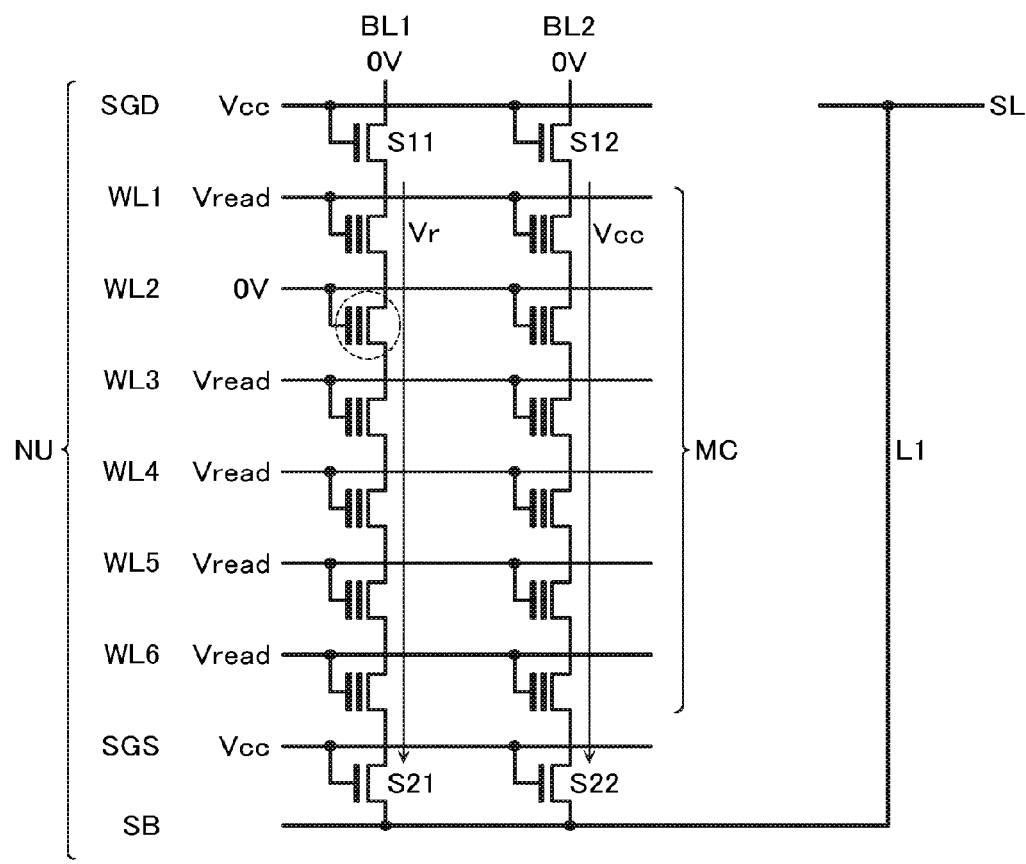
FIG. 9 is an equivalent circuit diagram showing an operation when performing read from the memory cell MC that has undergone write.

As shown in FIG. 9, during read, a potential of the selected word line WL2 corresponding to a read target memory cell MC is set to 0 V, and Vread is transferred to unselected word lines WL1 and WL3 to WL6. Then, a write state of the selected memory cell is read by whether a current flows in the selected bit line BL1 or not. The current flowing in the selected bit line BL1 at this time is borne by electrons hence flows in the n type oxide semiconductor similarly to during the write operation.

(Characteristics of Oxide Semiconductor)

Next, characteristics of the oxide semiconductor will be described. The oxide semiconductor is, as already explained, a compound of a certain specific substance and oxygen, and has characteristics of the kind described below.

Figure 10A:
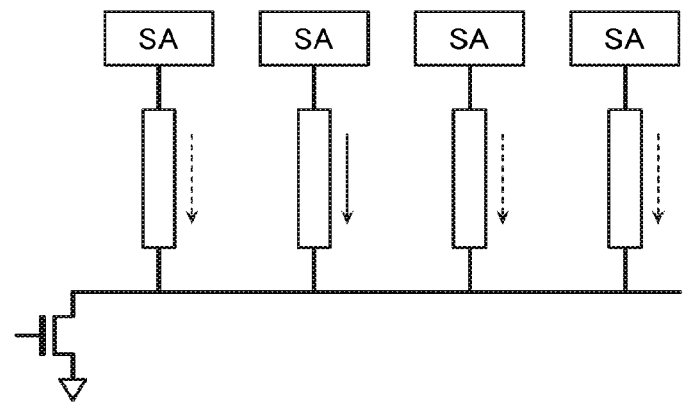
FIGS. 10A and 10B are views for explaining a relationship of On current and Off current when an oxide semiconductor is used as the channel material.
Figure 10B:
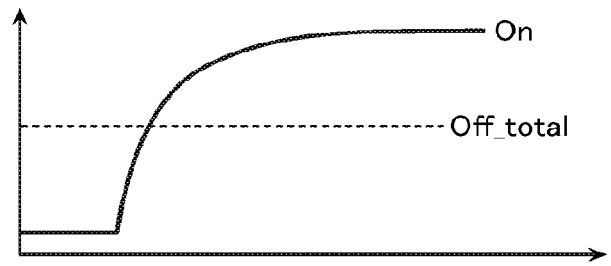
Figure 10C:
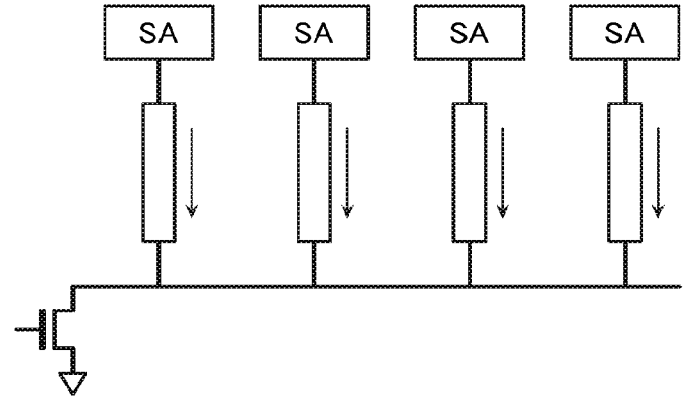
FIGS. 10C and 10D are views for explaining a relationship of On current and Off current when polysilicon is used as the channel material.
Figure 10D:
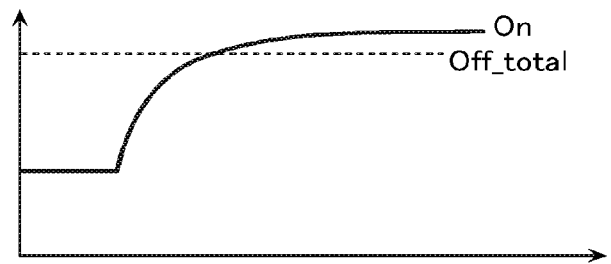

FIGS. 10A to 10D are conceptual diagrams and graphs explaining an On current and an Off current during device operation. Specifically, FIG. 10A is a conceptual diagram showing On current and Off current when an oxide semiconductor layer is employed as the channel, and FIG. 10B is a graph showing a relationship of Off current total and On current in that case. Moreover, FIG. 10C is a conceptual diagram showing On current and Off current when a polysilicon layer is employed as the channel, and FIG. 10D is a graph showing a relationship of Off current total and On current in that case.

As shown in FIG. 10A, when the oxide semiconductor is employed, a current flowing from an unselected memory cell (Off current: indicated by dotted line in FIG. 10A) is extremely small with respect to a current flowing in the selected memory cell (On current: indicated by solid line in FIG. 10A).

That being the case, as shown in FIG. 10B, a total of Off current (Off_ total) also has a value which is smaller than that of On current (On).

When selecting a memory cell, read is performed in a batch page-by-page, hence the larger the number of cells per one page becomes, the larger the total of Off current becomes. However, when the oxide semiconductor is used as described above, Off current is extremely smaller than On current, hence the number of cells per one page can be increased. That is, a page length can be increased. In addition, the number of cells that can be read simultaneously at one time also increases (simultaneous sensing is enabled). In other words, even if mobility lowers due to film thinning (even if On current lowers), Off current is extremely small, hence a problem is not caused in a NAND operation.

Figure 11A:
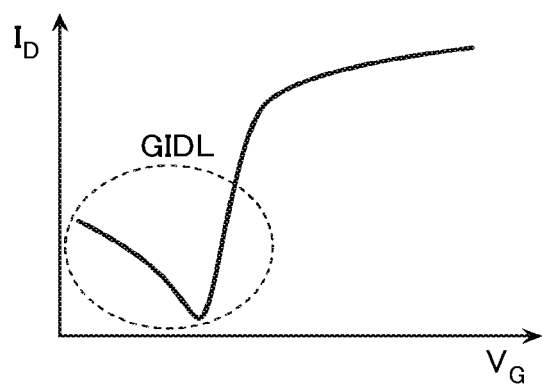
FIG. 11A is a graph for explaining a GIDL current.
Figure 11B:
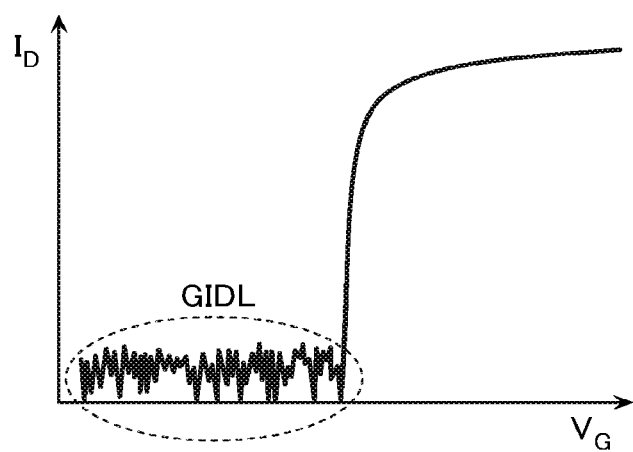
FIG. 11B is a graph showing a relationship of applied voltage and current when an n type oxide semiconductor is employed.

On the other hand, this merit of the Off current being small becomes a demerit during the erase operation. The reason for this will be explained using FIGS. 11A and 11B. FIGS. 11A and 11B are graphs showing a relationship of voltage and current applied to a transistor employing polysilicon and a transistor employing an n type oxide semiconductor, FIG. 11A showing the case of polysilicon, and FIG. 11B showing the case of an n type oxide semiconductor such as InGaZnO.

As shown in FIG. 11A, in the case of polysilicon, if a voltage of a certain value or more (forward bias) is applied, a current proportional to the applied voltage flows. However, as shown in the region surrounded by a dotted line, a current sometimes flows even when the applied voltage is reverse bias. This results from a tunnel phenomenon occurring between bands due to high electric field application, and the current flowing at this time is called a GIDL (Gate Induced Drain Leakage) current.

This GIDL current generates holes. In the memory cell employing polysilicon as the channel, the erase operation was performed using this GIDL current based on holes. That is, by injecting holes caused by this GIDL current into the memory cell injected with electrons, in other words, the memory cell that has undergone write, the injected electrons and holes were combined to be eliminated, whereby the erase operation was performed.

However, as shown in FIG. 11B, in the case of the n type oxide semiconductor, a GIDL current hardly occurs. This results from the fact that contrary to polysilicon, the oxide semiconductor has several defect levels existing close to a valence band. In other words, due to the existence of the defect level, the tunnel phenomenon between bands does not occur, and as a result, holes hardly occur. Therefore, in contrast to a transistor employing polysilicon, when employing an oxide semiconductor whose Off current is extremely small, an erase operation by injection of holes cannot be performed.

Accordingly, in the present embodiment, not only an n type oxide semiconductor but also a p type oxide semiconductor is employed as the channel of the memory cell MC. As a result, the p type oxide semiconductor layer can be utilized as a transmission channel of holes, thereby making it possible for the erase operation by hole injection to be performed similarly to conventionally.

Next, it will be described with reference to band diagrams specifically how electrons or holes which are carriers behave in the case that the oxide semiconductor having the above-described characteristics is used as the channel of the memory cell.

Figure 12A:
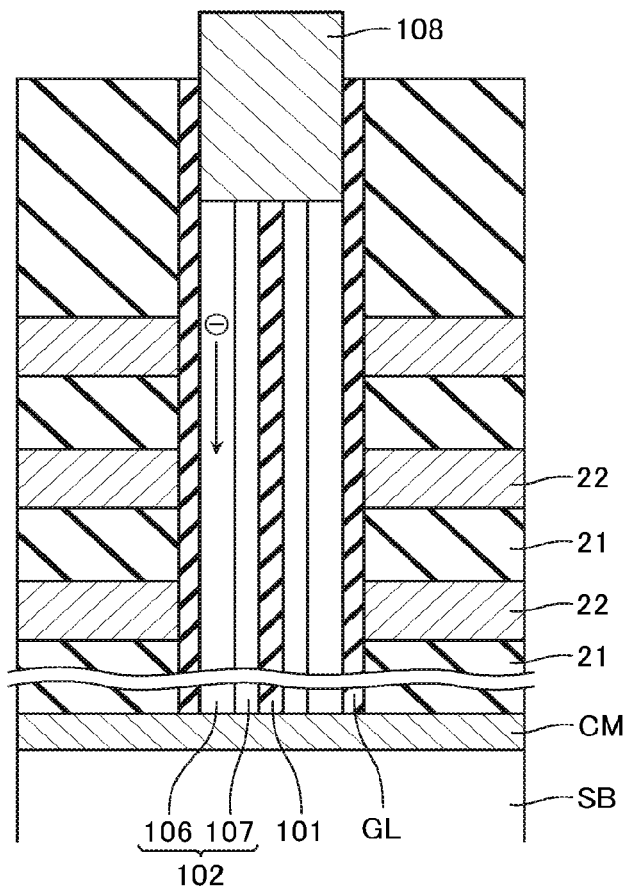
FIG. 12A is a schematic view for explaining operation of electrons when write is performed in the semiconductor memory device of the first embodiment.
Figure 12B:
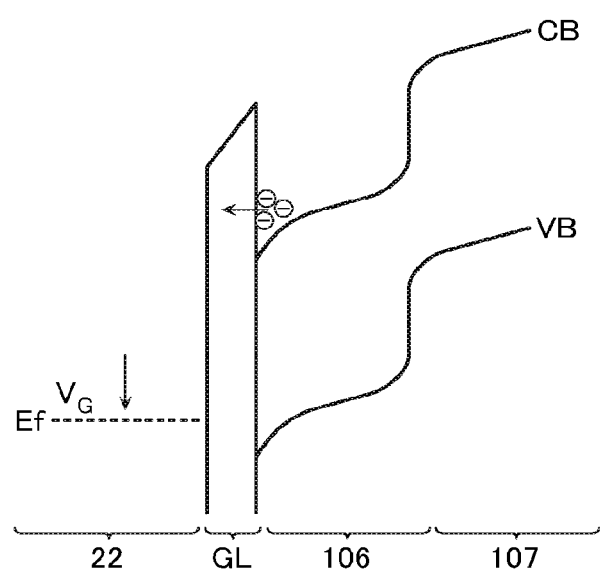
FIG. 12B is a band diagram for explaining a principle by which electrons are transmitted during a write operation described using FIG. 12A.

FIG. 12A is a schematic cross-sectional view for explaining behavior of electrons when performing write to a memory cell; and FIG. 12B is a band diagram showing band energy during write voltage application.

As explained by FIG. 7, during the write operation, electrons are the carriers. Moreover, when a certain voltage or more is applied to the oxide semiconductor layers 106 and 107 which are the channel as shown in the band diagram of FIG. 12B, the energy band changes (curves) as shown in FIG. 12B. Moreover, electrons that have been transmitted over the conduction band CB of the n type oxide semiconductor layer 106 are accumulated (an accumulation layer is formed) close to a boundary of the n type oxide semiconductor layer 106 and the memory gate insulating layer GL. Moreover, when a voltage value exceeds a threshold value (attains an inverted state), a potential difference between the n type oxide semiconductor layer 106 and the conductive layer 22 which is the gate electrode of the selected memory cell results in electrons being injected inside the charge accumulation film in the memory gate insulating layer GL, and write being executed.

In addition, as explained by FIG. 9, electrons are the carriers also for the read operation, hence behavior of electrons at this time is similar to in the case of the above-described write operation. That is, as shown in FIG. 12A, during write and during read, electrons are transmitted via the n type oxide semiconductor layer 106.

Figure 13A:
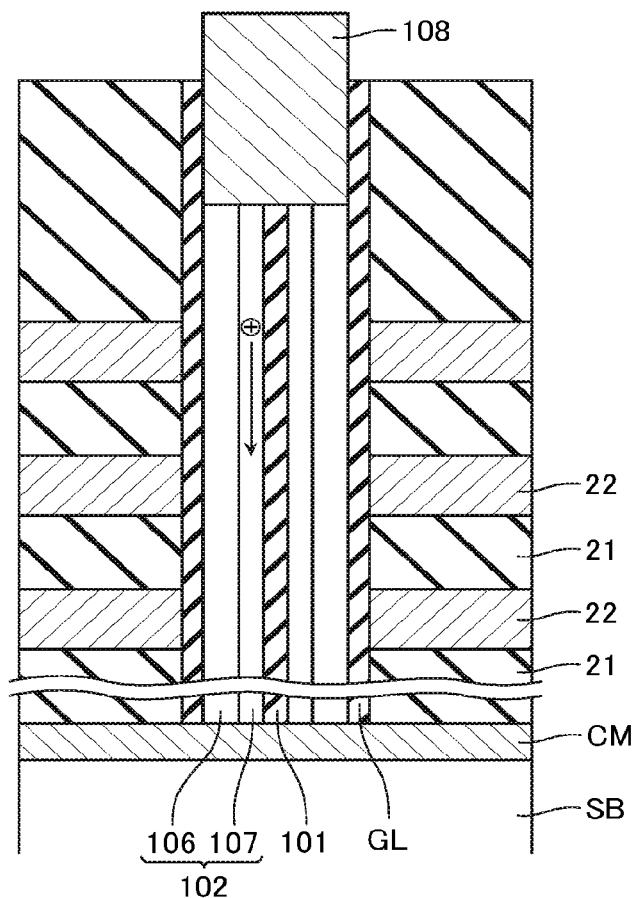
FIG. 13A is a schematic view for explaining operation of holes when erase is performed in the semiconductor memory device of the first embodiment.
Figure 13B:
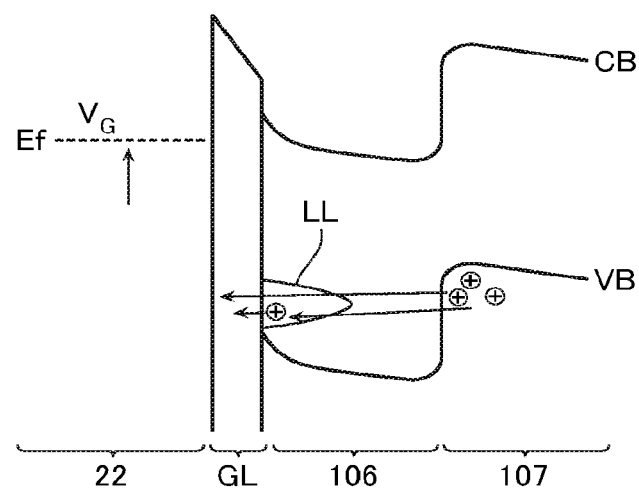
FIG. 13B is a band diagram for explaining a principle by which holes are transmitted during an erase operation described using FIG. 13A.

FIG. 13A is a schematic cross-sectional view for explaining behavior of holes when performing erase on a memory cell that has undergone write; and FIG. 13B is a band diagram showing band energy during erase voltage application.

As mentioned above, in an n type oxide semiconductor, a GIDL current is not generated, hence holes do not occur; however, in a p type oxide semiconductor, the carriers are holes, and this can be utilized to enable the erase operation by hole injection to be performed.

As shown in FIG. 13A, when the erase voltage is applied to the oxide semiconductor layer 102, a GIDL current is generated in the p type oxide semiconductor layer 107 and holes occur in the valence band VB of the p type oxide semiconductor layer 107. Moreover, the erase voltage results in holes being transferred via the p type oxide semiconductor layer 107.

The band diagram at this time (during erase voltage application) is as shown in FIG. 13B. As shown in this FIG. 13B, during the erase operation, a bias which is the reverse of that during the write operation is applied, and energy bands of the n type oxide semiconductor layer 106 and p type oxide semiconductor layer 107 are curved with a reverse inclination to that during the write operation. At this time, energy differs between the valence band VB of the p type oxide semiconductor layer 107 where holes exist and the valence band VB of the n type oxide semiconductor layer 106, and usually, holes generated in the p type oxide semiconductor layer 107 are not transferred via the n type oxide semiconductor layer 106.

However, as previously mentioned, the n type oxide semiconductor layer 106 has a localized level LL close to the valence band VB, and this localized level LL is used as a hopping site to cause hopping of holes being transmitted in the p type oxide semiconductor layer 107. In other words, a tunnel phenomenon accompanying thermal excitation occurring between a level of holes and the localized level LL of the n type oxide semiconductor layer 106 makes it possible for holes to be injected to the inside of the charge accumulation film of the selected memory cell.

As explained above, employing both an n type oxide semiconductor layer and a p type oxide semiconductor layer as the channel makes it possible for both electrons and holes to be injected into the charge accumulation layer. Therefore, flexibility in selection of the charge accumulation layer is possible. Moreover, utilizing the fact that leak current during Off of an oxide semiconductor is small enables an increase in page length or simultaneous sensing.

Second Embodiment

Next, a second embodiment will be described.

Figure 14:
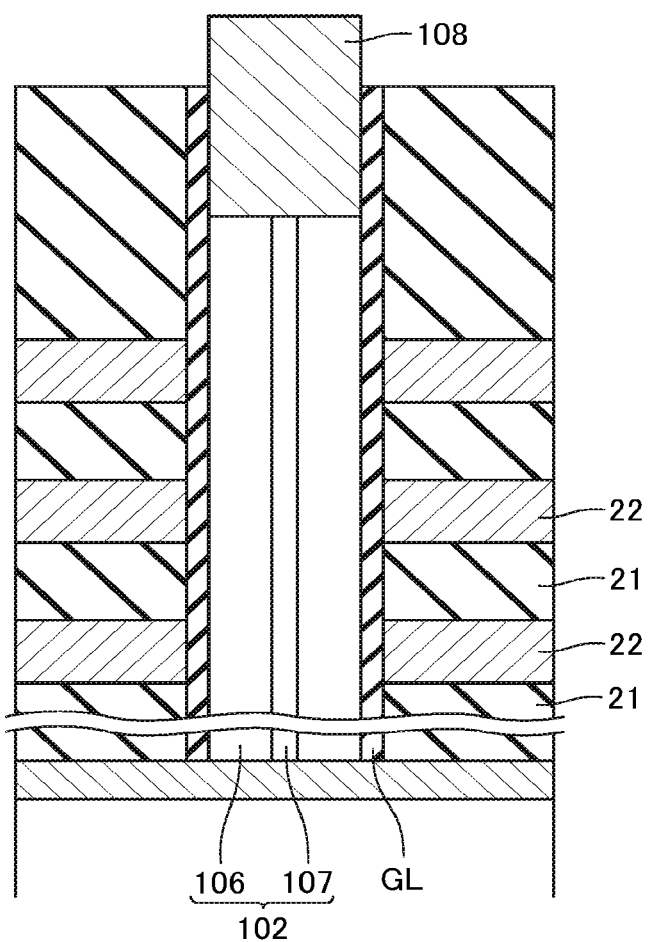
FIG. 14 is a schematic cross-sectional view showing a configuration of a semiconductor memory device of a second embodiment.

FIG. 14 is a schematic cross-sectional view showing a structure of a portion including a memory cell of a semiconductor memory device of the second embodiment.

The semiconductor memory device of the second embodiment has a largely identical structure to that of the semiconductor memory device of the first embodiment, but a structure of the oxide semiconductor layer 102 differs from that of the first embodiment.

That is, in the first embodiment, the oxide semiconductor layer 102 had a columnar shape extending in a direction of stacking of the inter-layer insulating layer 21 and conductive layer 22 and surrounding the periphery of the core 101. However, in the second embodiment, that core does not exist.

In the second embodiment, the oxide semiconductor layer 102 has a two-layer structure of the n type oxide semiconductor layer 106 and the p type oxide semiconductor layer 107. Moreover, one (the outside) oxide semiconductor layer (in FIG. 14, the n type oxide semiconductor layer 106) has a cylindrical shape surrounding a periphery of the other (the inside) oxide semiconductor layer (in FIG. 14, the p type oxide semiconductor layer 107).

In the case of employing polysilicon as the channel as in a conventional semiconductor memory device, first, silicon in an amorphous state is filled inside the memory hole, and then an annealing step is undergone, whereby a polysilicon layer is formed.

A temperature in this annealing step is extremely high (approximately 800° C. to 1000° C.). Therefore, there is a risk that when annealing processing is applied to the amorphous state silicon, migration occurs, and as a result, a seam ends up occurring in the polysilicon layer and there ends up being a lowering of mobility or an insulation state.

Accordingly, in a conventional structure employing polysilicon, in order to prevent occurrence of the seam after the annealing processing, a core configured from the likes of silicon oxide was implanted after filling with the amorphous state silicon and before the annealing processing, and occurrence of the seam was prevented.

However, a process temperature when an oxide semiconductor is employed is low, being about 400° C. Hence, it is difficult for migration to occur, and occurrence of the seam can also be suppressed. Therefore, when an oxide semiconductor is employed as a channel material, it becomes unnecessary to dispose a conventional kind of core.

This not only enables the process to be abbreviated by one step, but also makes it possible for a diameter of the oxide semiconductor layer to be reduced to an extent of a core portion, whereby film thinning of the channel is achieved.

Third Embodiment

A semiconductor memory device of a third embodiment will be described with reference to FIG. 15.

Described above were three-dimensional type semiconductor memory devices in which a plurality of memory cells are stacked in a direction intersecting a substrate surface. However, a structure other than this may be adopted.

Figure 15:
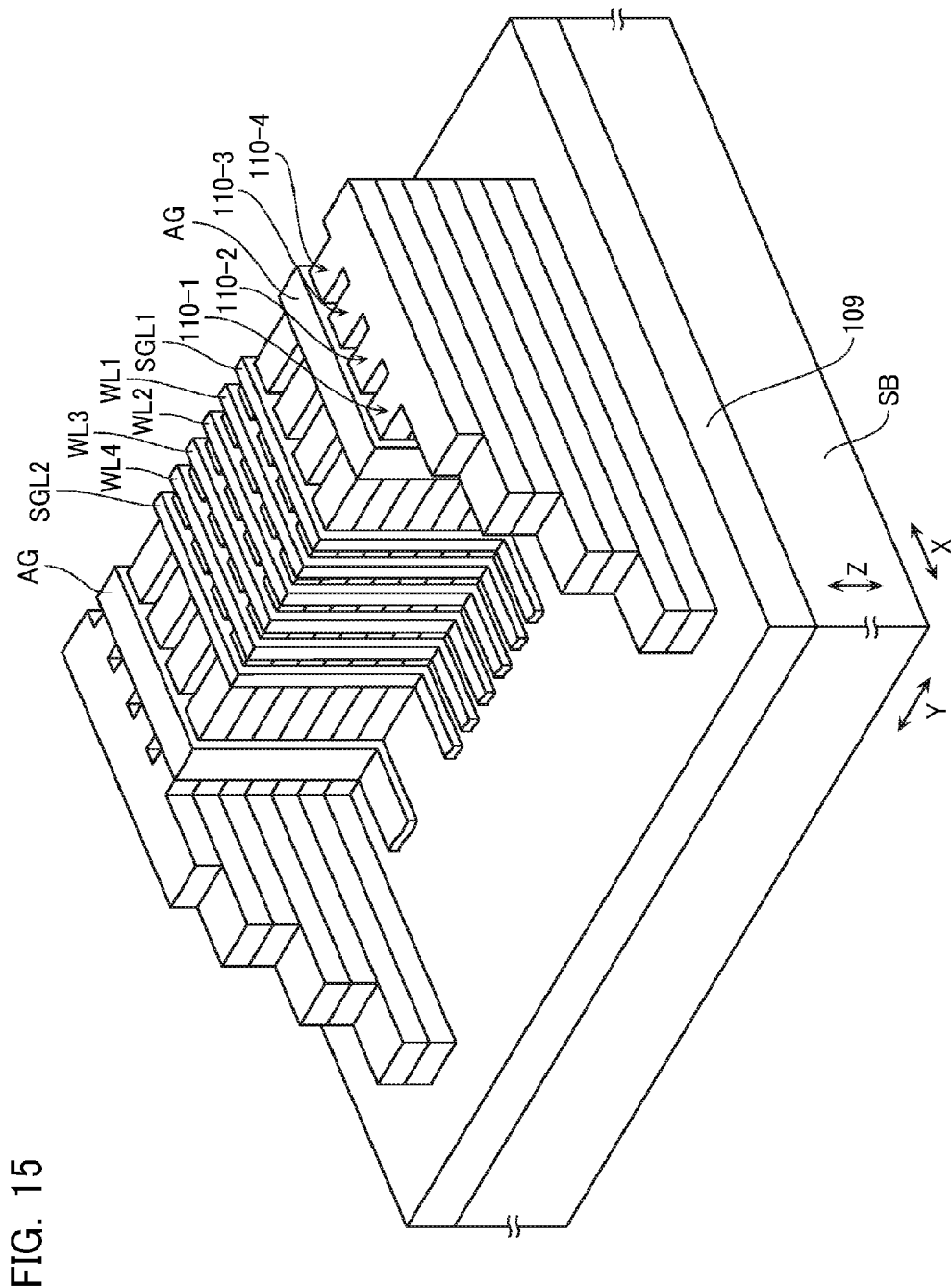
FIG. 15 is a schematic perspective view showing a configuration of a semiconductor memory device of a third embodiment.

For example, it is possible to adopt a structure of the kind shown in FIG. 15. The semiconductor memory device shown in FIG. 15 comprises fin type stacked structures 110-1 to 110-4 configuring a memory cell array, via an element isolation insulating layer 109, on a substrate SB configured from a silicon substrate, for example. Each of these fin type stacked structures 110-1 to 110-4 includes a plurality of memory strings of a NAND type flash memory, and forms a body portion of a memory cell. That is, in the present embodiment, a plurality of the memory cells are arranged in a direction parallel to a surface of the substrate SB.

This semiconductor memory device comprises the following, in addition to such fin type stacked structures 110-1 to 110-4, namely: word lines WL1 to WL4; select gate lines SC1 and SC2; assist gate lines AGL1 to AGL4; and unillustrated bit lines and a source line, and thereby configures a three-dimensionally shaped NAND type flash memory. One block of the memory cell array may be formed by a set of a plurality of pairs of groups of the fin type stacked structures 110-1 to 110-4 of the kind shown in FIG. 15.

As shown in FIG. 15, the fin type stacked structures 110-1 to 110-4 extend in a Y axis direction parallel to the substrate SB and are arranged with a certain pitch in an X axis direction. Each of these fin type stacked structures 110-1 to 110-4 has a structure in which a plurality of memory strings are stacked. Moreover, each of these fin type stacked structures 110-1 to 110-4 comprises: an oxide semiconductor layer functioning as a body portion of the memory string; and an inter-layer insulating film formed between these oxide semiconductor layers.

In the present embodiment, the stacked structure of the n type oxide semiconductor layer and the p type oxide semiconductor layer explained in the above-described embodiments is adopted for the oxide semiconductor layer having this fin type stacked structure. Materials or operation related to other configurations are similar to those of the above-described embodiments.

By adopting the fin type stacked structure of the kind of the present embodiment, a larger gate volume can be secured with respect to a substrate area. Moreover, the gate is disposed so as to surround the channel from three directions. Therefore, precision of channel control by the gate improves, and leak current when the device is off is significantly reduced. As a result, the threshold value can be set low, and an improvement in switching speed and reduction in power consumption are expected.

Fourth Embodiment

A fourth embodiment will be described using FIGS. 16 to 18.

The semiconductor memory devices in the first through third embodiments described up to now had a three-dimensional structure in which memory cells are disposed three-dimensionally on a substrate. However, this fourth embodiment differs from the above-described embodiments in having a two-dimensional structure in which memory cells are arranged two-dimensionally on a substrate.

Figure 16:
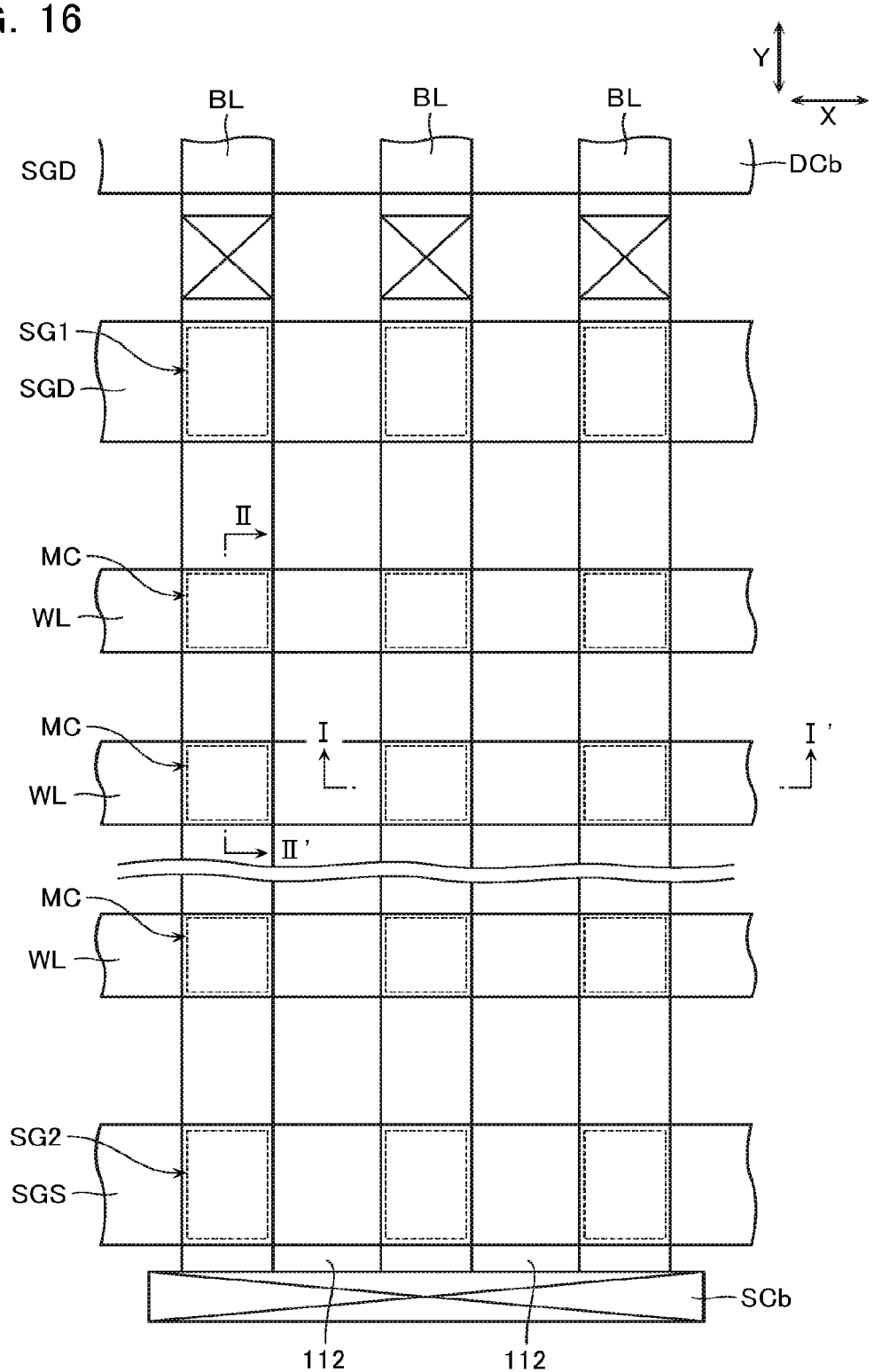
FIG. 16 is a schematic plan view showing a configuration of a semiconductor memory device of a fourth embodiment.

FIG. 16 shows one example of a schematic configuration of a memory cell array of a semiconductor memory device according to the present embodiment. Word lines WL and bit lines BL are arranged intersecting each other, and a memory cell MC is formed at each of intersections of the word lines WL and bit lines BL.

A plurality of the memory cells MC aligned in a bit line BL direction are connected in series by sharing the oxide semiconductor layer 102 which is the channel disposed on the substrate. The plurality of series-connected memory cells MC configure one memory string. One end of the memory string is connected to the bit line BL via a drain side select gate transistor SG1. The bit line BL and the drain side select gate transistor SG1 are connected via a drain side contact DCb.

Moreover, the other end of the memory string is connected to an unillustrated source line SL via a source side select gate transistor SG2. The source line SL and the source side select gate transistor SG2 are connected via a source side contact SCb.

A gate of the drain side select gate transistor SG1 is connected to a drain side select gate line SGD arranged in parallel to the word line WL. Moreover, a gate of the source side select gate transistor SG2 is connected to a source side select gate line SGS arranged in parallel to the word line WL. Now, a direction in which the word line WL extends will be defined as a word line direction (X direction), and a direction in which the bit line BL extends will be defined as a bit line direction (Y direction).

Figure 17:
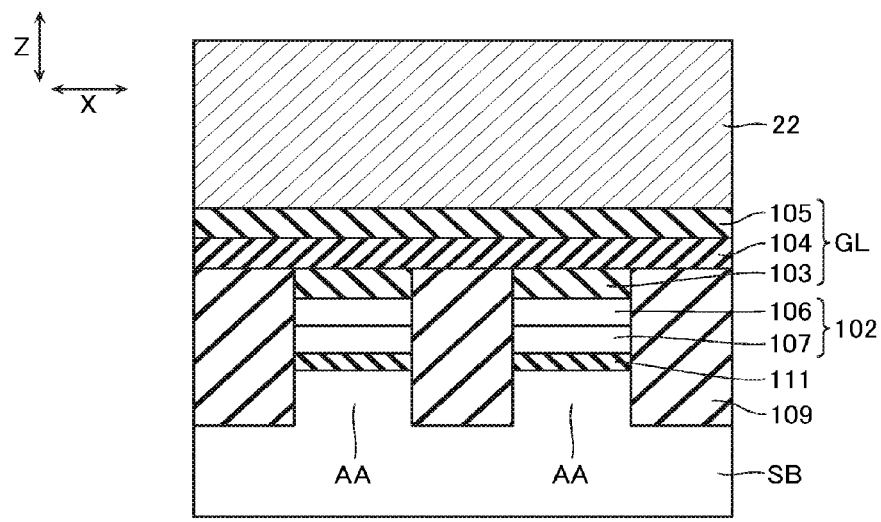
FIG. 17 is a cross-sectional view taken along the line I-I' of FIG. 16.

FIG. 17 is a cross-sectional view taken along the line I-I' of FIG. 16. FIG. 18 is a cross-sectional view taken along the line II-II' of FIG. 16. Note that FIGS. 17 and 18 show cross-sectional views for the memory cell MC, but the present embodiment may adopt a similar configuration also for each of the select gate transistors (SG1 and SG2).

Figure 18:
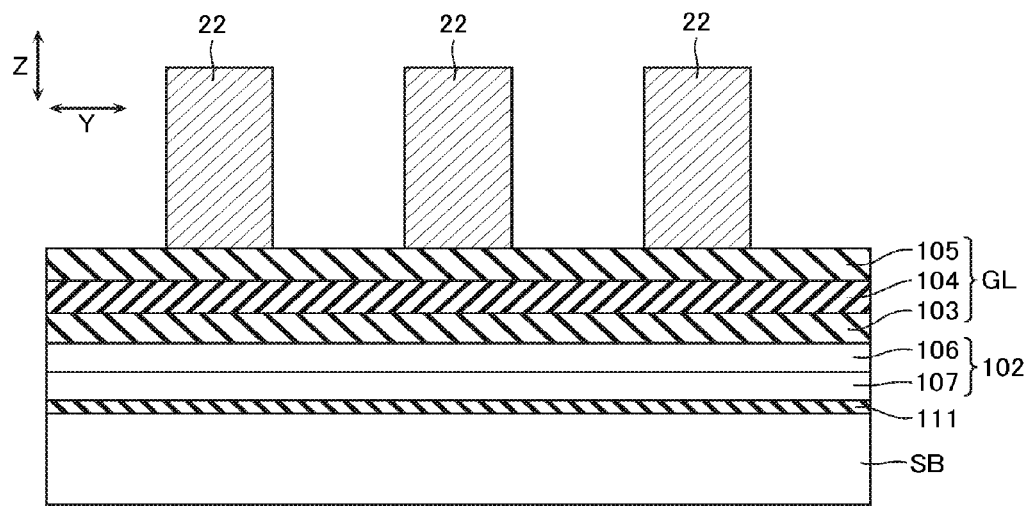
FIG. 18 is a cross-sectional view taken along the line II-II' of FIG. 16.

As shown in FIGS. 17 and 18, the plurality of memory cells MC shown in FIG. 16 are formed on a substrate SB configured from the likes of silicon. Moreover, formed in a surface of this substrate SB, at certain intervals in the X direction, are element isolation insulating films 109 that extend having the Y direction as their longitudinal direction.

The element isolation insulating film 109 is formed from silicon oxide ($SiO_2$), for example. A region of the substrate SB sandwiched by the element isolation insulating films 109 is an active area (AA) where the memory string (memory cell) is formed. That is, the surface of the substrate SB is electrically isolated into a plurality of the active areas AA, by the element isolation insulating films 109. The active areas AA, similarly to the element isolation insulating films 109, extend having the Y direction as their longitudinal direction and are formed at certain intervals in the X direction.

As shown in FIGS. 17 and 18, the plurality of memory cells MC each comprise: an insulating layer 111 disposed on the substrate SB; the oxide semiconductor layer 102 functioning as the channel; and the memory gate insulating layer GL. Usable as a material of the insulating layer 111 is, for example, silicon oxide.

The oxide semiconductor layer 102 has a structure in which the p type oxide semiconductor layer 107 and the n type oxide semiconductor layer 106 are stacked sequentially from a substrate SB side. The memory gate insulating layer GL has a structure in which the tunnel insulating layer 103, the memory layer 104 including the charge accumulation layer, and the block insulating layer 105 are stacked from an oxide semiconductor layer 102 side.

Moreover, formed on the memory gate insulating layer GL is the conductive layer 22 which is a gate electrode functioning as a control gate. Moreover, although not illustrated in FIG. 18, an inter-layer insulating layer configured from the likes of silicon oxide is disposed in an upper portion of the conductive layer 22 and between the conductive layers 22.

Materials and operation of each of configurations of the flat type semiconductor memory device in this fourth embodiment are similar to those of the three-dimensional type semiconductor memory devices described in the first through third embodiments.

In a flat type semiconductor memory device such as in this embodiment, conventionally there was a need to remove the charge accumulation layer between the memory cells MC, by the likes of etching, and thereby divide between the memory cells. This is because there was a risk that when the charge accumulation layer between the memory cells MC is connected, electrons move within the charge accumulation layer whereby data written to a write target memory cell is destroyed or erroneous data is written to a non-write target memory cell.

However, in the present embodiment, erase of data is performed by hole injection. Moreover, holes never move within the charge accumulation layer. Therefore, there is no need to remove the charge accumulation layer between the memory cells to divide between the memory cells. That is, in the present embodiment, the charge accumulation layer is disposed straddling a plurality of the memory cells MC.

This makes it possible to prevent the word line (conductive layer 22 above the memory cell) getting thinned under the influence of etching, and makes it possible for deterioration of cell characteristics to be suppressed.

Modified Example

Figure 19:
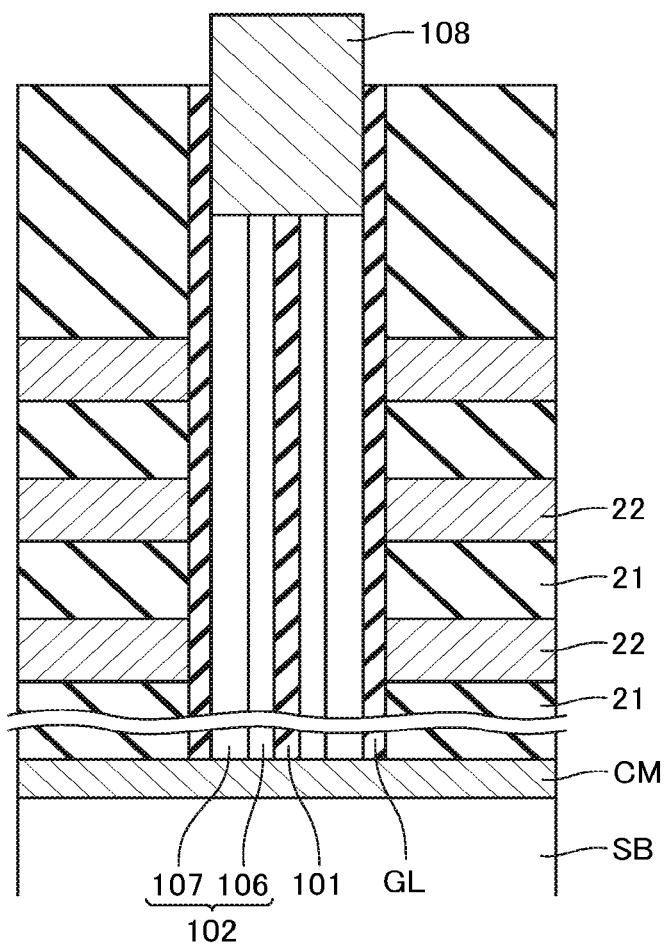
FIG. 19 is a schematic cross-sectional view showing a configuration example of a semiconductor memory device of one modified example.

In the above embodiments, the structure of the oxide semiconductor layer 102 was described as a stacked structure of an n type oxide semiconductor layer of the likes of InGaZnO and a p type oxide semiconductor layer of the likes of $Cu_2O$, and as a structure in which the n type oxide semiconductor layer is disposed on a memory gate insulating layer side (gate side). This is in order that by disposing the n type oxide semiconductor layer 106 on the memory gate insulating layer side, the n type oxide semiconductor layer 106 and the conductive layer 22 which is the gate electrode are made closely adjacent and a threshold value is secured, whereby a starting up operation of the device is speeded up. However, the above embodiments are not limited to this, and under certain conditions, it is also possible to adopt a reverse structure, in other words, as shown in FIG. 19, a structure in which the p type oxide semiconductor layer 107 is disposed on the memory gate insulating layer GL side.

For example, sometimes, as a result of the n type oxide semiconductor layer 106 being disposed on the memory gate insulating layer GL side, scattering of the n type oxide semiconductor layer 106 due to lattice vibration or an impurity becomes too large. In such a case, movement of electrons is hindered and mobility ends up lowering. It is conceivable that by disposing the p type oxide semiconductor layer 107 on the memory gate insulating layer GL side at this time, scattering of the n type oxide semiconductor layer 106 is suppressed and lowering of mobility of electrons is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell, and
a control unit that performs a write operation and an erase operation to the memory cell,
the memory cell comprising: an oxide semiconductor layer; a gate electrode; and a charge accumulation layer disposed between the oxide semiconductor layer and the gate electrode,
the oxide semiconductor layer including a stacked structure of an n type oxide semiconductor layer and a p type oxide semiconductor layer,
wherein the control unit, during the erase operation, provides a higher voltage to the oxide semiconductor layer than to the gate electrode.

2. The semiconductor memory device according to claim 1, further comprising
a plurality of the memory cells,
wherein the charge accumulation layer is disposed straddling the plurality of memory cells.

3. The semiconductor memory device according to claim 1, wherein
the oxide semiconductor layer includes the stacked structure in which the n type oxide semiconductor layer and the p type oxide semiconductor layer are provided in this order from the charge accumulation layer side.

4. The semiconductor memory device according to claim 1, wherein
the oxide semiconductor layer includes the stacked structure in which the p type oxide semiconductor layer and the n type oxide semiconductor layer are provided in this order from the charge accumulation layer side.

5. The semiconductor memory device according to claim 1, wherein
the n type oxide semiconductor layer includes indium, gallium, zinc, and oxygen, and
the p type oxide semiconductor layer includes: at least one of copper and tin; and oxygen.

6. A semiconductor memory device, comprising:
a memory cell,
the memory cell comprising: an oxide semiconductor layer; a gate electrode; and a charge accumulation layer disposed between the oxide semiconductor layer and the gate electrode,
the oxide semiconductor layer including a stacked structure of an n type oxide semiconductor layer and a p type oxide semiconductor layer, wherein
disposed in part of the oxide semiconductor layer is a contact layer including at least one of indium zinc oxide, indium tin oxide, titanium, molybdenum, gold, gallium zinc oxide, aluminum, zinc oxide, platinum, nickel, and tin.

7. The semiconductor memory device according to claim 6, wherein
the n type oxide semiconductor layer includes indium, gallium, zinc, and oxygen,
the p type oxide semiconductor layer includes copper and oxygen, and
the contact layer includes at least one of indium zinc oxide and gold.

8. The semiconductor memory device according to claim 6, wherein
the n type oxide semiconductor layer includes indium, gallium, zinc, and oxygen, the p type oxide semiconductor layer includes tin and oxygen, and the contact layer includes at least one of indium tin oxide, titanium, aluminum, and gold.

9. A semiconductor memory device, comprising:
a memory cell,
the memory cell comprising: an oxide semiconductor layer; a gate electrode; and a charge accumulation layer disposed between the oxide semiconductor layer and the gate electrode,
the oxide semiconductor layer including a stacked structure of an n type oxide semiconductor layer and a p type oxide semiconductor layer, wherein
the semiconductor memory device further
comprises a substrate, and
includes a structure in which the oxide semiconductor layer is disposed above the substrate, the charge accumulation layer is disposed above the oxide semiconductor layer, and the gate electrode is disposed above the charge accumulation layer.

10. The semiconductor memory device according to claim 9, further comprising
a plurality of the memory cells,
wherein the charge accumulation layer is disposed straddling the plurality of memory cells.

11. The semiconductor memory device according to claim 9, wherein
the oxide semiconductor layer includes the stacked structure in which the n type oxide semiconductor layer and the p type oxide semiconductor layer are provided in this order from the charge accumulation layer side.

12. The semiconductor memory device according to claim 9, wherein
the oxide semiconductor layer includes the stacked structure in which the p type oxide semiconductor layer and the n type oxide semiconductor layer are provided in this order from the charge accumulation layer side.

13. The semiconductor memory device according to claim 9, wherein
the n type oxide semiconductor layer includes indium, gallium, zinc, and oxygen, and
the p type oxide semiconductor layer includes: at least one of copper and tin; and oxygen.

14. A semiconductor memory device, comprising:
a plurality of memory cells,
the plurality of memory cells comprising:
a plurality of conductive layers that are stacked;
a charge accumulation layer having a first surface and a second surface opposite to the first surface, the second surface disposed facing side surfaces of the plurality of conductive layers; and
an oxide semiconductor layer disposed facing the first surface of the charge accumulation layer,
the oxide semiconductor layer including a stacked structure of an n type oxide semiconductor layer and a p type oxide semiconductor layer.

15. The semiconductor memory device according to claim 14, wherein
the oxide semiconductor layer extends in a direction that the conductive layers are stacked, and one of the n type oxide semiconductor layer and the p type oxide semiconductor layer surrounds a periphery of the other.

16. The semiconductor memory device according to claim 14, further comprising
a control unit that performs a write operation and an erase operation to the plurality of memory cells,
wherein the control unit, during the erase operation, provides a higher voltage to the oxide semiconductor layer than to the plurality of conductive layers.

17. The semiconductor memory device according to claim 14, wherein
the charge accumulation layer is disposed straddling the plurality of memory cells.

18. The semiconductor memory device according to claim 14, wherein
the oxide semiconductor layer includes the stacked structure in which the n type oxide semiconductor layer and the p type oxide semiconductor layer are provided in this order from the charge accumulation layer side.

19. The semiconductor memory device according to claim 14, wherein
the oxide semiconductor layer includes the stacked structure in which the p type oxide semiconductor layer and the n type oxide semiconductor layer are provided in this order from the charge accumulation layer side.

20. The semiconductor memory device according to claim 14, wherein
the n type oxide semiconductor layer includes indium, gallium, zinc, and oxygen and
the p type oxide semiconductor layer includes: at least one of copper and tin; and oxygen.

21. The semiconductor memory device according to claim 14, wherein
disposed in part of the oxide semiconductor layer is a contact layer including at least one of indium zinc oxide, indium tin oxide, titanium, molybdenum, gold, gallium zinc oxide, aluminum, zinc oxide, platinum, nickel, and tin.

22. The semiconductor memory device according to claim 21, wherein
the n type oxide semiconductor layer includes indium, gallium, zinc, and oxygen,
the p type oxide semiconductor layer includes copper and oxygen, and
the contact layer includes at least one of indium zinc oxide and gold.

23. The semiconductor memory device according to claim 21, wherein
the n type oxide semiconductor layer includes indium, gallium, zinc, and oxygen,
the p type oxide semiconductor layer includes tin and oxygen, and
the contact layer includes at least one of indium tin oxide, titanium, aluminum, and gold.

* * * * *